(12) United States Patent
Manickam et al.

(10) Patent No.: US 10,838,021 B2
(45) Date of Patent: Nov. 17, 2020

(54) APPARATUS AND METHOD FOR SIMULTANEOUS RAMSEY VECTOR MAGNETOMETRY

(71) Applicant: LOCKHEED MARTIN CORPORATION, Bethesda, MD (US)

(72) Inventors: Arul Manickam, Bethesda, MD (US); Peter G. Kaup, Bethesda, MD (US); Jon C. Russo, Bethesda, MD (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 117 days.

(21) Appl. No.: 16/032,038

(22) Filed: Jul. 10, 2018

(65) Prior Publication Data

US 2019/0018075 A1 Jan. 17, 2019

Related U.S. Application Data

(60) Provisional application No. 62/531,337, filed on Jul. 11, 2017.

(51) Int. Cl.
  *G01R 33/032* (2006.01)
  *G01N 21/64* (2006.01)
  *G01N 22/00* (2006.01)

(52) U.S. Cl.
  CPC .......... *G01R 33/032* (2013.01); *G01N 21/64* (2013.01); *G01N 22/00* (2013.01)

(58) Field of Classification Search
  CPC ....... G01R 33/032; G01N 21/64; G01N 22/00
  See application file for complete search history.

(56) References Cited

U.S. PATENT DOCUMENTS

| 10,338,162 | B2* | 7/2019 | Reynolds | G01R 33/26 |
| 2016/0054402 | A1* | 2/2016 | Meriles | G01R 33/282 |
| | | | | 324/309 |
| 2018/0246030 | A1* | 8/2018 | Ota | G01B 11/00 |

\* cited by examiner

*Primary Examiner* — Dominic E Hawkins
(74) *Attorney, Agent, or Firm* — Foley & Lardner LLP

(57) ABSTRACT

The present disclosure relates to apparatuses and methods to utilize techniques to simultaneously measure Ramsey pulses on a plurality of axes of the magneto-optical defect center material with defect centers. When measuring simultaneously, there is potentially no relative sensitivity loss relative to scalar measurements. Therefore, Ramsey pulses on a plurality of axes of a magneto-optical defect material with defect centers are measured while bypassing the sensitivity loss incurred with sequential measurement techniques. The axes are interrogated simultaneously while allowing for isolation of the individual responses from the signal detected from the magneto-optical defect center material. In some embodiments, the system utilizes a special Ramsey pulse sequence pair or a 'shifted magnetometry adapted cancellation' (SMAC) pair to detect and measure the magnetic field acting on the system.

27 Claims, 12 Drawing Sheets

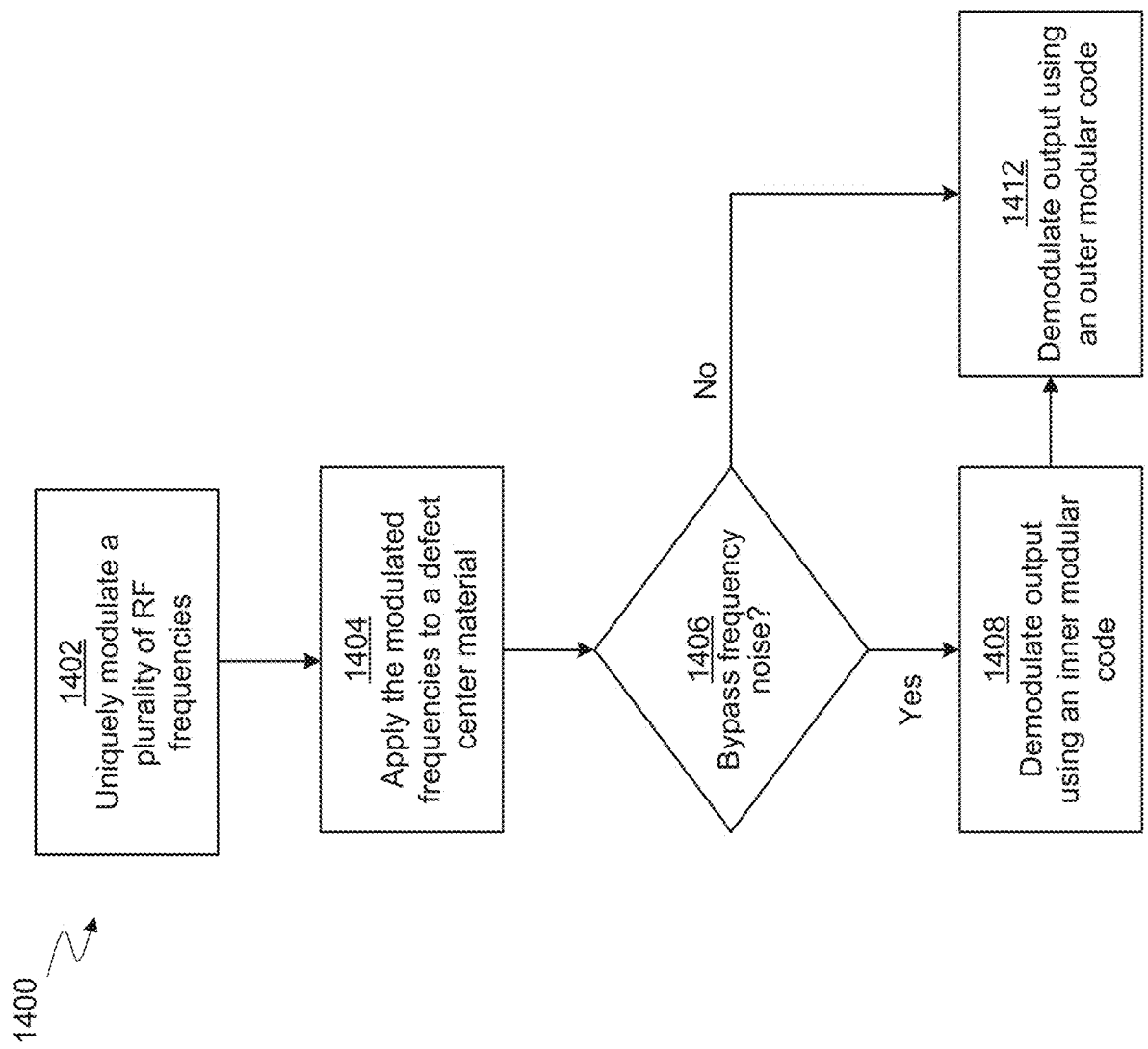

APPARATUS AND METHOD FOR SIMULTANEOUS RAMSEY VECTOR MAGNETOMETRY

CROSS-REFERENCE TO RELATED APPLICATIONS

This application claims the benefit of and priority to U.S. Provisional Application No. 62/531,337 filed on Jul. 11, 2017, the entire disclosure of which is incorporated by reference herein.

FIELD

The present disclosure relates to magnetic detection systems, and more generally, to measurement and signal processing methods for a magnetic detection system.

BACKGROUND

A number of industrial applications, as well as scientific areas such as physics and chemistry can benefit from magnetic detection and imaging with a device that has extraordinary sensitivity, ability to capture signals that fluctuate very rapidly (bandwidth) all with a substantive package that is extraordinarily small in size and efficient in power. Many advanced magnetic imaging systems can require operation in restricted conditions, for example, high vacuum and/or cryogenic temperatures, which can make them inapplicable for applications that require ambient or other conditions.

SUMMARY

Some embodiments relate to a system that may comprise: a magneto-optical defect center material comprising a plurality of defect centers and lattice oriented subsets, a radio frequency (RF) excitation source configured to provide RF excitation to the magneto-optical defect center material, an optical excitation source configured to provide optical excitation to the magneto-optical defect center material, an optical detector configured to receive an optical signal emitted by the magneto-optical defect center material, a bias magnet configured to separate RF resonance responses of the lattice oriented subsets of the magneto-optical defect center material, and a controller. In some embodiments, the control may be configured to control the optical excitation source and the RF excitation source to apply a first binary code sequence to the magneto-optical defect center material comprised of a first binary code sequence value and a second binary code sequence value using a first RF frequency value and control the optical excitation source and the RF excitation source to apply a second binary code sequence to the magneto-optical defect center material comprised of the first binary code sequence value and the second binary code sequence value using a second RF frequency value. The first binary code sequence value may comprise a first optical excitation pulse, a first pair of RF excitation pulses separated by a first time period, and a second optical excitation pulse to the magneto-optical defect center material. In some embodiments, the controller may further be configured to control the optical excitation source and the RF excitation source to apply a third binary code sequence to the magneto-optical defect center material comprised of the first binary code sequence value and the second binary code sequence value using a third RF frequency value. The third binary code sequence may be orthogonal to the first binary code sequence and to the second binary code sequence. In some embodiments, the controller may further be configured to modulate the light detection signal from the optical detector using the third binary code sequence by: sending the light detection signal to a third modulator for the third binary code sequence, sending the output of the third modulator to a third low pass filter, and sending the output of the second modulator to a second low pass filter. In some embodiments, the controller may further be configured to estimate the magnetic field projection further based on the output of the third low pass filter. In some embodiments, the controller may further be configured to compute a change in an external magnetic field acting on the magneto-optical defect center material based on the estimate of the magnetic field projection.

Other embodiments relate to a method using a magneto-optical defect center material comprising a plurality of defect centers, the method comprising: applying a first binary code sequence to the magneto-optical defect center material comprised of a first binary code sequence value and a second binary code sequence value using a first RF frequency value, applying a second binary code sequence to the magneto-optical defect center material comprised of the first binary code sequence value and the second binary code sequence value using a second RF frequency value, and modulating a light detection signal from the optical detector using the first binary code sequence and the second binary code sequence. Modulating the light detection signal may comprise splitting the light detection signal to a first light detection signal and a second light detection signal, modulating the first light detection signal using the first binary code sequence, modulating the second light detection signal using the second binary code sequence, low pass filtering the modulated first light detection signal, and low pass filtering the modulated second light detection signal, and estimating a magnetic field projection based on the low pass filtered, modulated first light detection signal and the low pass filtered, modulated second light detection signal. In some embodiments, the first binary code sequence value may comprise a first optical excitation pulse, a first pair of RF excitation pulses separated by a first time period, and a second optical excitation pulse to the magneto-optical defect center material. In some embodiments, the second binary code sequence value may comprise a third optical excitation pulse, a second pair of RF excitation pulses separated by a second time period, and a fourth optical excitation pulse to the magneto-optical defect center material. In some embodiments, the first binary code sequence may be orthogonal to the second binary code sequence. In some embodiments, a pulse width of the first pair of RF excitation pulses is different than a pulse width of the second pair of RF excitation pulses, and the first time period is different than the second time period. In some embodiments, the second binary code sequence value comprises a third optical excitation pulse, a second pair of RF excitation pulses separated by a second time period, and a fourth optical excitation pulse to the magneto-optical defect center material. In some embodiments, the first binary code sequence is orthogonal to the second binary code sequence. In some embodiments, a pulse width of the first pair of RF excitation pulses is different than a pulse width of the second pair of RF excitation pulses, and the first time period is different than the second time period. In some embodiments, the method may further comprise computing a change in an external magnetic field acting on the magneto-optical defect center material based on the estimate of the magnetic field projection.

Other embodiments relate to a system that may comprise: a defect center material responsive to an applied magnetic field and a radio frequency (RF) emitter operational to provide a first binary code sequence to the defect center material using a first RF frequency value and a second binary code sequence to the defect center material using a second RF frequency value. In some embodiment, the binary code sequences may be comprised of first binary code sequence values and second binary code sequence values, wherein the first binary code sequence value comprises a first RF pulse sequence separated by at least one pause and the second binary code sequence value comprises a second RF pulse sequence that is different from the first RF pulse sequence. The system may further comprise a detector operational to measure a fluorescence of the defect center material in conjunction with the first binary code sequence value and the second binary code sequence value and a control circuit connected to the detector and operational to modulate the measured fluorescence using the first binary code sequence and the second binary code sequence.

Other embodiments relate to a system that may comprise a magneto-optical defect center material comprising a plurality of defect centers, a means of providing RF excitation to the magneto-optical defect center material, a means of providing optical excitation to the magneto-optical defect center material, a means of receiving an optical signal emitted by the magneto-optical defect center material, a means of providing a bias magnetic offset to distinguish response curves of different lattice orientation subsets of the magneto-optical defect center material, and a means of controlling the provided RF excitation and provided optical excitation. In some embodiments, the means of controlling the provided RF excitation and provided optical excitation control the provided RF excitation and provided optical excitation to apply a first binary code sequence to the magneto-optical defect center material comprised of a first binary code sequence value and a second binary code sequence value using a first RF frequency value, and apply a second binary code sequence to the magneto-optical defect center material comprised of the first binary code sequence value and the second binary code sequence value using a second RF frequency value. In some embodiments, the first binary code sequence value may comprise a first optical excitation pulse, a first pair of RF excitation pulses separated by a first time period, and a second optical excitation pulse to the magneto-optical defect center material. In some embodiments, the second binary code sequence value may comprise a third optical excitation pulse, a second pair of RF excitation pulses separated by a second time period, and a fourth optical excitation pulse to the magneto-optical defect center material. In some embodiments, the first binary code sequence may be orthogonal to the second binary code sequence. In some embodiments, a pulse width of the first pair of RF excitation pulses may be different than a pulse width of the second pair of RF excitation pulses, and the first time period may be different than the second time period. In some embodiments, the system may further comprise a means to modulate a light detection signal from the optical detector using the first binary code sequence and the second binary code sequence by sending the light detection signal to a first modulator for the first binary code sequence, sending the light detection signal to a second modulator for the second binary code sequence, sending the output of the first modulator to a first low pass filter, and sending the output of the second modulator to a second low pass filter. In some embodiments, the system may further comprise a means to estimate a magnetic field projection based on the output of the first low pass filter and the output of the second low pass filter.

In some embodiments of the above systems and methods, the first RF frequency value may be associated with a first axis of a defect center of the magneto-optical defect center material and the second RF frequency value may be associated with a second axis of a defect center of the magneto-optical defect center material. In some embodiments, the second pair of RF excitation pulses of the first pulse sequence may be applied at a frequency detuned from a resonance frequency of the magneto-optical defect center material. In some embodiments, the pulse width of the second pair of RF excitation pulses may be associated with a fluorescence null point of the magneto-optical defect center material. In some embodiments, the second time period may be associated with a fluorescence null point of the magneto-optical defect center material. In some embodiments, the pulse width of the second pair of RF excitation pulses and the second time period may be associated with a fluorescence null point of the magneto-optical defect center material. In some embodiments, the RF excitation source may be a microwave antenna. In some embodiments, the first binary code sequence may comprise the first binary code sequence value followed by the second binary sequence value. In some embodiments, the pulse width of the first pair of RF excitation pulses and the first time period may be associated with a fluorescence low point of the magneto-optical defect center material. In some embodiments, the bias magnet is one of a permanent magnet, a magnet field generator, or a Halbach set of permanent magnets.

BRIEF DESCRIPTION OF THE DRAWINGS

FIG. 14 is a flow diagram of a method of simultaneously measuring Ramsey pulses on a plurality of axes of a magneto-optical defect center material in accordance with some embodiments.

DETAILED DESCRIPTION

Figure 1:
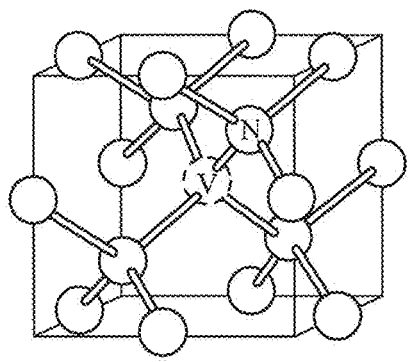
FIG. 1 illustrates a defect center in a diamond lattice in accordance with some illustrative embodiments.

In the following detailed description, reference is made to the accompanying drawings, which form a part hereof. In the drawings, similar symbols typically identify similar components, unless context indicates otherwise. The illustrative embodiments described in the detailed description, drawings, and claims are not meant to be limiting. Other embodiments may be utilized, and other changes may be made, without departing from the spirit or scope of the subject matter presented. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Magneto-optical defect center materials such as diamonds with nitrogen vacancy (NV) centers can be used to detect magnetic fields. Atomic-sized nitrogen-vacancy (NV) centers in diamond lattices can have excellent sensitivity for magnetic field measurement and can enable fabrication of small magnetic sensors. The sensing capabilities of diamond NV (DNV) sensors may be maintained at room temperature and atmospheric pressure and these sensors can be even used in liquid environments.

Excitation light, such as green light, which enters a diamond structure with defect centers interacts with defect centers, and fluorescent light, which is red, is emitted from the diamond. The intensity of red light emitted can be used to determine the strength and direction of the magnetic field. The efficiency and accuracy of sensors using magneto-optical defect center materials such as diamonds with NV centers (generally, DNV sensors) is increased by transferring as much light as possible from the defect centers to the photo sensor that measures the amount of red light. Magneto-optical defect center materials include but are not be limited to diamonds, Silicon Carbide (SiC) and other materials with nitrogen, boron, or other chemical defect centers.

Magnetic vector measurements using magneto-optical defect center materials with defect centers can be taken sequentially by interrogating a plurality of the axes of the material sequentially. In sequential Ramsey measurements, each axis of the magnate-optical defect material with defect centers is interrogated sequentially resulting in an approximate loss of sensitivity relative to scalar measurements of 1/(the square-root of the number of axes used). With sequential measurements, there is therefore a two times sensitivity loss relative to scalar magnetometry for four axes.

In some embodiments, systems and methods are described to utilize techniques to simultaneously measure Ramsey pulses on a plurality of axes of the magneto-optical defect center material with defect centers. When measuring simultaneously, there is potentially no relative sensitivity loss relative to scalar measurements. Therefore, Ramsey pulses on a plurality of axes of a magneto-optical defect material with defect centers (e.g., a DNV), are measured while bypassing the sensitivity loss incurred with sequential measurement techniques. The axes are interrogated simultaneously while allowing for isolation of the individual responses from the signal detected from the magneto-optical defect center material.

In some embodiments, the system utilizes a special Ramsey pulse sequence pair or a 'shifted magnetometry adapted cancellation' (SMAC) pair to detect and measure the magnetic field acting on the system. These parameters include the resonant Rabi frequency, the free precession time (tau), the RF pulse width, and the detuning frequency, all of which help improve the sensitivity of the measurement. For a SMAC pair measurement, two different values of tau are used as well as two different values of the pulse width for each measurement of the pair. This is in contrast to Ramsey excitation measurement where a single pulse sequence is repeated in which there may be repolarization of the system, double RF pulses separated by a gap for the free precession time, a start of the optical excitation and a readout during the optical excitation. In a SMAC excitation, second set of RF pulses can be utilized having a pulse width and tau values which may be different from the pulse width and tau of the first set. The first set of RF pulses is done with the first set of values, there is repolarization of the system, and then the second set of values is used to create an inverted curve. The SMAC pair estimate is a combination of the magnetometry curves of the two pulse sequences with different values. The regular curves and inverted curves can be used as two different values of a binary code to create a custom set of binary codes for each of a plurality of axes of the magneto-defect center material. In some embodiments, the binary codes for each of the axes are orthogonal to each other.

In some embodiments, using the SMAC technique or SMAC pair measurement to perform a differential measurement technique, low-frequency noise such as vibrations, laser drift, low-frequency noise in the receiver circuits, residual signals from previous measurements (e.g., from previous measurements on other lattice vectors), and the like get canceled out. benefit of the SMAC technique is that certain types of low-frequency intensity noise (e.g. vibrations, laser drift, low-frequency noise in the receiver circuits, residual signals from previous measurements on other lattice vectors) get cancelled out through the differential measurement technique. In some embodiments, this may provide a sensitivity increase at lower frequencies where colored noise may be the strongest. In some embodiments, the low-frequency noise cancelation may be due to slowly varying noise in the time domain appearing almost identically in the two sequential sets of Ramsey measurements in the SMAC pair measurement. In some embodiments, inverting the second Ramsey set and subtracting the measurement from the first Ramsey set may largely cancel out any noise that is added post-inversion. Inverting the second Ramsey set and then subtracting its measurement off from the first may therefore largely cancel out any noise that is added post-inversion. In some embodiments, the low frequency noise cancelation may be due to regarding the SMAC technique as a digital modulation technique, whereby, in the frequency domain, the magnetic signals of interest are modulated up to a carrier frequency of half the sampling rate (inverting every second set of Ramsey measurements is equivalent to multiplying the signal by $e^{i\pi n}$ where n is the sample (i.e., Ramsey pulse number). In some embodiments, this may shift the magnetic signals of interest to a higher frequency band that is separated from the low-frequency colored noise region. Then, a high-pass filter may be applied to the signal to remove the noise, and finally, the signal may be shifted back to baseband. In some embodiments, performing a differential measurement may be equivalent to a two-tap high-pass filter, followed by a 2× down-sampling. In some embodiments, higher-order filters may be used to provide more out-of-band noise rejection to leave more bandwidth for the signal of interest.

The defect center in a diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. Conventionally, the neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
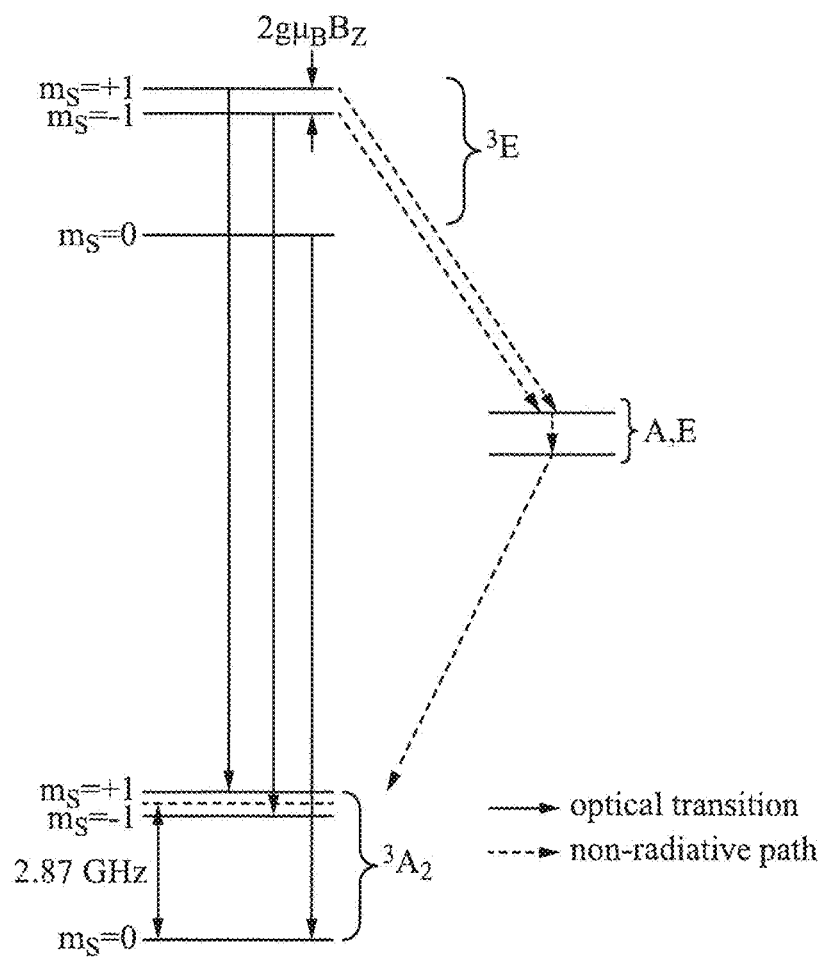
FIG. 2 illustrates an energy level diagram showing energy levels of spin states for a defect center in accordance with some illustrative embodiments.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm 1$ energy levels are offset from the $m_s=0$ due to spin-spin interactions, and the $m_s=\pm 1$ energy levels are degenerate, i.e., they have the same energy. The $m_s=0$ spin state energy level is split from the $m_s=\pm 1$ energy levels by an energy of 2.87 GHz for a zero external magnetic field.

Introducing an external magnetic field with a component along the NV axis lifts the degeneracy of the $m_s=\pm 1$ energy levels, splitting the energy levels $m_s=\pm 1$ by an amount $2g\mu_B Bz$, where g is the g-factor, $\mu_B$ is the Bohr magneton, and Bz is the component of the external magnetic field along the NV axis. This relationship is correct to a first order and inclusion of higher order corrections is a straightforward matter and will not affect the computational and logic steps in the systems and methods described below.

The NV center electronic structure further includes an excited triplet state $^3E$ with corresponding $m_s=0$ and $m_s=\pm 1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s=\pm 1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm 1$ spins states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm 1$ states than for the $m_s=0$ spin state. This is so because the decay via the intermediate states does not result in a photon emitted in the fluorescence band, and because of the greater probability that the $m_s=\pm 1$ states of the excited triplet $^3E$ state will decay via the non-radiative decay path. The lower fluorescence intensity for the $m_s=\pm 1$ states than for the $m_s=0$ spin state allows the fluorescence intensity to be used to determine the spin state. As the population of the $m_s=\pm 1$ states increases relative to the $m_s=0$ spin, the overall fluorescence intensity will be reduced.

Figure 3:
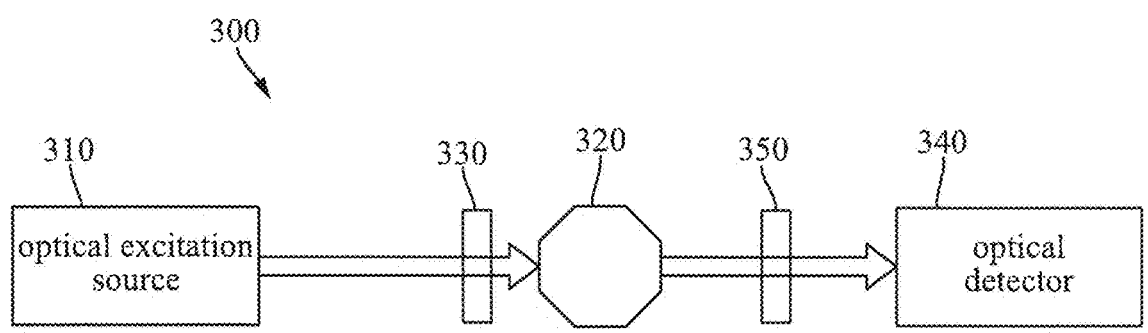
FIG. 3 is a schematic diagram illustrating a defect center magnetic sensor system in accordance with some illustrative embodiments.

FIG. 3 is a schematic diagram illustrating a magneto-optical defect center magnetic sensor system 300 that uses fluorescence intensity to distinguish the ms=±1 states, and to measure the magnetic field based on the energy difference between the ms=+1 state and the ms=−1 state. The system 300 includes an optical excitation source 310, which directs optical excitation to a magneto-optical defect center material 320 with defect centers (e.g., NV diamond material). The system further includes an RF excitation source 330, which provides RF radiation to the magneto-optical defect center material 320. Light from the NV diamond may be directed through an optical filter 350 to an optical detector 340.

In some implementations, the RF excitation source 330 may be a microwave coil. The RF excitation source 330, when emitting RF radiation with a photon energy resonant with the transition energy between ground ms=0 spin state and the ms=+1 spin state, excites a transition between those spin states. For such a resonance, the spin state cycles between ground ms=0 spin state and the ms=+1 spin state, reducing the population in the ms=0 spin state and reducing the overall fluorescence at resonances. Similarly, resonance occurs between the ms=0 spin state and the ms=−1 spin state of the ground state when the photon energy of the RF radiation emitted by the RF excitation source is the difference in energies of the ms=0 spin state and the ms=−1 spin state, or between the ms=0 spin state and the ms=+1 spin state, there is a decrease in the fluorescence intensity.

In some implementations, the optical excitation source 310 may be a laser or a light emitting diode which emits light in the green. In some implementations, the optical excitation source 310 induces fluorescence in the red, which corresponds to an electronic transition from the excited state to the ground state. In some implementations, light from the magneto-optical defect center material 320 is directed through the optical filter 350 to filter out light in the excitation band (in the green, for example), and to pass light in the red fluorescence band, which in turn is detected by the detector 340. The optical excitation light source 310, in addition to exciting fluorescence in the diamond material 320, also serves to reset the population of the ms=0 spin state of the ground state 3A2 to a maximum polarization, or other desired polarization.

Figure 4:
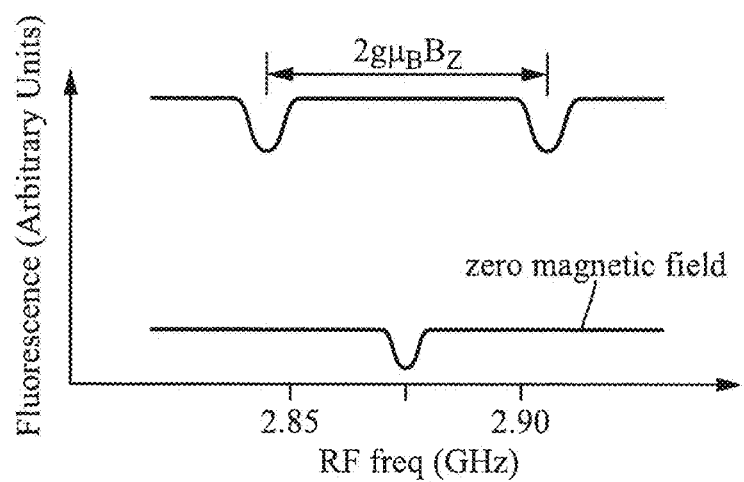
FIG. 4 is a graph illustrating the fluorescence as a function of an applied RF frequency of a defect center along a given direction for a zero magnetic field.

For continuous wave excitation, the optical excitation source 310 continuously pumps the magneto-optical defect centers, and the RF excitation source 330 sweeps across a frequency range that includes the zero splitting (when the $m_s=\pm 1$ spin states have the same energy) photon energy of 2.87 GHz. The fluorescence for an RF sweep corresponding to a magneto-optical defect center material 320 with magneto-optical defect centers aligned along a single direction is shown in FIG. 4 for different magnetic field components Bz along the defect center axis, where the energy splitting between the $m_s=-1$ spin state and the $m_s=+1$ spin state increases with Bz. Thus, the component Bz may be determined. Optical excitation schemes other than continuous wave excitation are contemplated, such as excitation schemes involving pulsed optical excitation, and pulsed RF excitation. Examples of pulsed excitation schemes include Ramsey pulse sequence (described in more detail below), and spin echo pulse sequence.

For continuous wave excitation, the optical excitation source 310 may continuously pump the defect centers, and the RF excitation source 330 may sweep across a frequency range that includes the zero splitting (when the ms=±1 spin states have the same energy) photon energy of 2.87 GHz. The fluorescence for an RF sweep corresponding to a magneto-optical defect center material 320 with defect centers aligned along a single direction for different magnetic field components Bz along the defect center axis, where the energy splitting between the ms=−1 spin state and the ms=+1 spin state increases with Bz. Thus, the component Bz may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence. The excitation scheme utilized during the measurement collection process (i.e., the applied optical excitation and the applied RF excitation) may be any appropriate excitation scheme. For example, the excitation scheme may utilize continuous wave (CW) magnetometry, pulsed magnetometry, and variations on CW and pulsed magnetometry (e.g., pulsed RF excitation with CW optical excitation). In cases where Ramsey pulse RF sequences are used, pulse parameters π and τ may be determined as described in, for example, U.S. patent application Ser. No. 15/003,590, which is incorporated by reference herein in its entirety.

Figure 5:
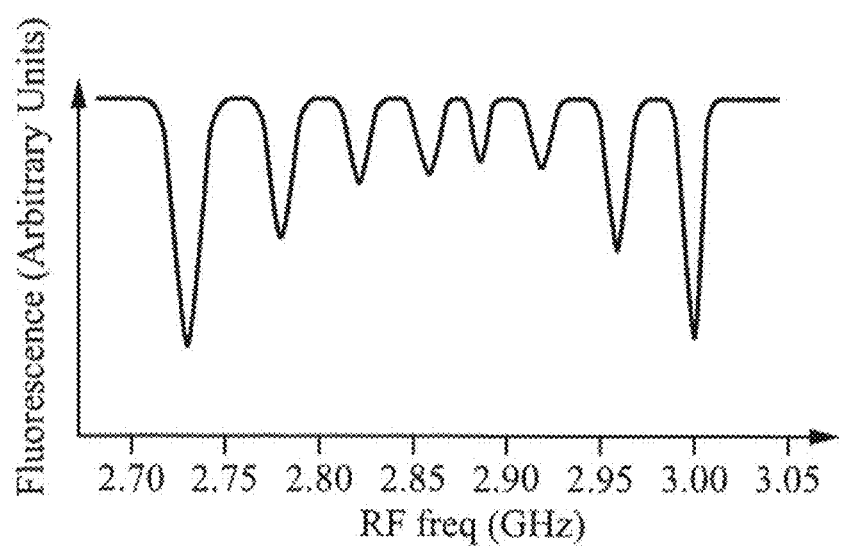
FIG. 5 is a graph illustrating the fluorescence as a function of an applied RF frequency for four different defect center orientations for a non-zero magnetic field.

In general, the magneto-optical defect center material 320 has defect centers aligned along directions of four different orientation classes. FIG. 5 illustrates fluorescence as a function of RF frequency for the case where the magneto-optical defect center material 320 has defect centers aligned along directions of four different orientation classes. In this case, the component Bz along each of the different orientations may be determined. These results, along with the known orientation of crystallographic planes of a magneto-optical defect center material lattice, allow not only the magnitude of the external magnetic field to be determined, but also the direction of the magnetic field.

In general, the magnetic sensor system may employ a variety of different magneto-optical defect center material, with a variety of magneto-optical defect centers. Magneto-optical defect center materials include but are not be limited to diamonds, Silicon Carbide (SiC) and other materials with nitrogen, boron, or other defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material.

Figure 6:
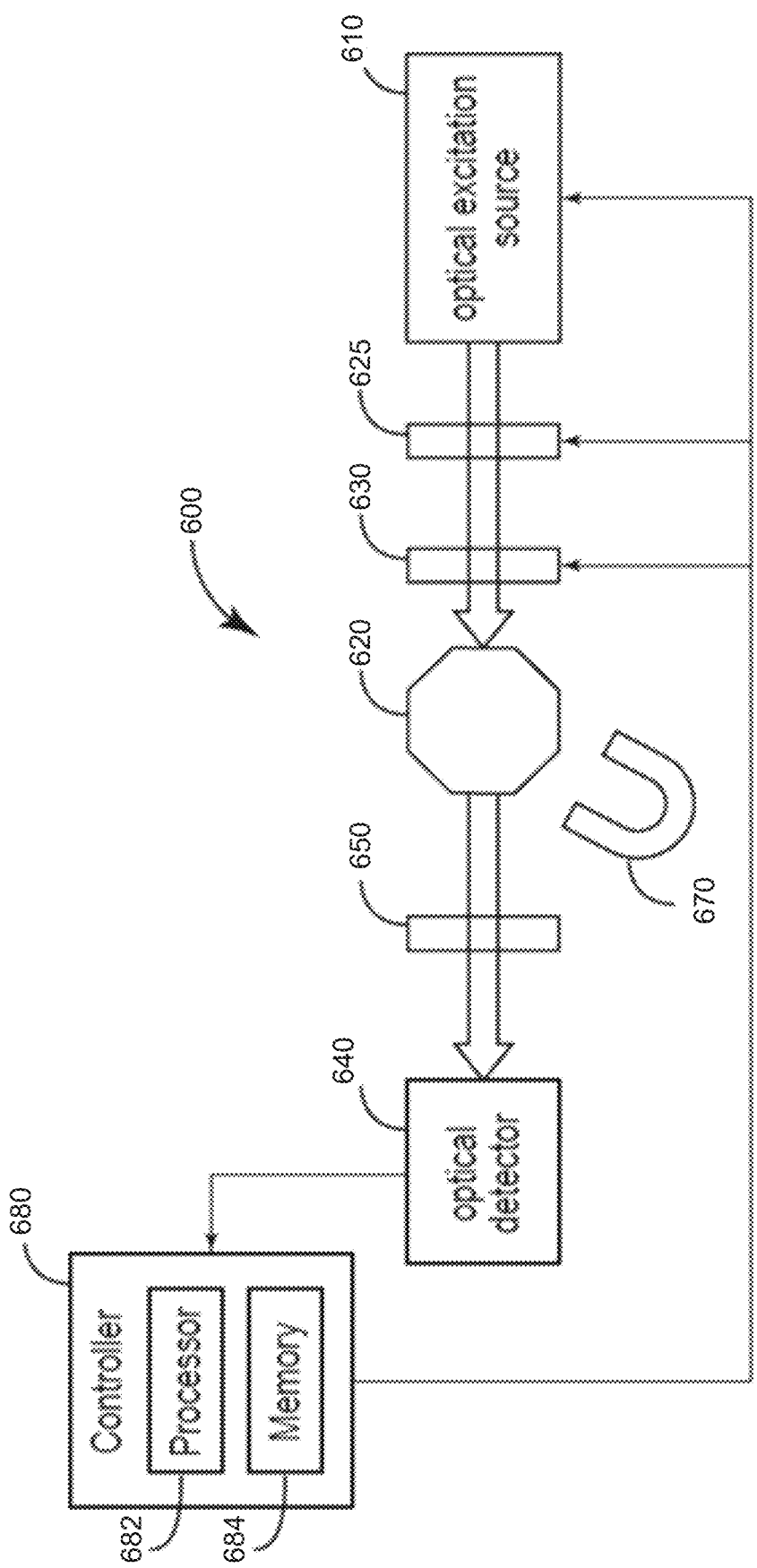
FIG. 6 a schematic diagram illustrating a magnetic field detection system according to some embodiments.

FIG. 6 is a schematic diagram of a system 600 for a magnetic field detection system according to some embodiments. The system 600 includes an optical excitation source 610, which directs optical excitation through a waveplate assembly 625 to a diamond with nitrogen vacancy (NV) centers or another magneto-optical defect center material with magneto-optical defect centers 620. An RF excitation source 630 provides RF radiation to the magneto-optical defect center material 620. A magnetic field generator 670 generates a magnetic field, which is detected at the magneto-optical defect center material 620. Specifically, the magnetic field generator 670 may be used to apply a bias magnetic field that sufficiently separates the intensity responses corresponding to electron spin resonances for each of the lattice vectors. The controller 680 may then control the optical excitation source 610 to provide optical excitation to the NV diamond material 620 and the RF excitation source 630 to provide RF excitation to the magneto-optical defect center material with magneto-optical defect centers 620. The resulting fluorescence intensity responses for each of the lattice vectors may be collected over time to determine the components of the external magnetic field Bz aligned along directions of the lattice vectors corresponding to magneto-optical defect center material crystallographic axes which may then be used to calculate the estimated vector magnetic field acting on the system 600. In some embodiments, the magnetic field generator 670 may be a permanent magnet positioned relative to the magneto-optical defect center material 620, which generates a known, uniform magnetic field (e.g., a bias or control magnetic field) to produce a desired fluorescence intensity response from the magneto-optical defect center material 620.

In some implementations, the magnetic field generator 670 may generate magnetic fields with orthogonal polarizations. The magnetic field generator 670 may include two or more magnetic field generators, such as two or more Helmholtz coils. The two or more magnetic field generators may be configured to provide a magnetic field having a predetermined direction, each of which provide a relatively uniform magnetic field at the magneto-optical defect center material 620. The predetermined directions may be orthogonal to one another. In addition, the two or more magnetic field generators of the magnetic field generator 670 may be disposed at the same position, or may be separated from each other. In the case that the two or more magnetic field generators are separated from each other, the two or more magnetic field generators may be arranged in an array, such as a one-dimensional or two-dimensional array, for example.

The system 600 includes, in some implementations, a waveplate assembly 625. In some implementations, the waveplate assembly 625 is configured to adjust the polarization of the light (e.g., light from a laser) as it the light is passed through the waveplate assembly 625. In some implementations, the waveplate assembly 625 is configured to mount a waveplate to allow for rotation of the waveplate with the ability to stop the plate into a position at a specific rotation. In some implementations, the waveplate assembly 625 is configured to allow for rotation of the waveplate with the ability to lock the plate in to a position at a specific rotation. Stopping the waveplate at a specific rotation allows the configuration of the waveplate assembly 625 to tune the polarization of the light passing through the waveplate. In some implementations, the waveplate assembly 625 is configured to adjust the polarization of the light such that the orientation of a given lattice of a magneto-optical defect center material allows the contrast of a dimming Lorentzian to be deepest and narrowest such that the slope of each side of the Lorentzian is steepest. In some implementations, the waveplate assembly 625 is configured such that the polarization of the light is lined up with the orientation of a given lattice of a magneto-optical defect center material such that it allows extraction of maximum sensitivity of the lattice (i.e., maximum sensitivity of a vector in free space). In some implementations, the waveplate assembly 625 is configured such that four determined positions of the waveplate maximize the sensitivity across all the different lattices of a magneto-optical defect center material. In some implementations, the waveplate assembly 625 is configured where the position of the waveplate is such that similar sensitivities are achieved to the four Lorentzians corresponding to lattices of a magneto-optical defect center material. Different waveplates may be used in different implementations, including but not limited to half-wave plates and quarter-wave plates.

The system 600 may be arranged to include one or more optical detection systems, comprising an optical detector 640, optical excitation source 610, and magneto-optical defect center material 620. Furthermore, the magnetic field generator 670 may have a relatively high power as compared to the optical detection systems. In this way, the optical detection systems may be deployed in an environment that requires a relatively lower power for the optical detection systems, while the magnetic field generator 670 may be deployed in an environment that has a relatively high power available for the magnetic field generator 670 so as to apply a relatively strong magnetic field.

In some implementations, the system 600 further includes a controller 680 arranged to receive a light detection signal from the optical detector 640 and to control the optical excitation source 610, the RF excitation source 630, and a second magnetic field generator (not shown). The controller may be a single controller, or multiple controllers. For a controller including multiple controllers, each of the controllers may perform different functions, such as controlling different components of the system 600. The second magnetic field generator may be controlled by the controller 680 via an amplifier.

In some implementations, the RF excitation source 630 is a microwave coil, for example. The RF excitation source 630 is controlled to emit RF radiation with a photon energy resonant with the transition energy between the ground ms=0 spin state and the ms=±1 spin states as discussed above with respect to FIG. 3.

The optical excitation source 610 may be a laser or a light emitting diode, for example, which emits light in the green, for example. The optical excitation source 610 induces fluorescence in the red from the Magneto-optical defect center material 620, where the fluorescence corresponds to an electronic transition from the excited state to the ground state. Light from the Magneto-optical defect center material 620 is directed through the optical filter 650 to filter out light in the excitation band (in the green, for example), and to pass light in the red fluorescence band, which in turn is detected by the optical detector 640. The optical excitation light source 610, in addition to exciting fluorescence in the Magneto-optical defect center material 620, also serves to reset the population of the ms=0 spin state of the ground state 3A2 to a maximum polarization, or other desired polarization.

In some implementations, the controller 680 is arranged to receive a light detection signal from the optical detector 640 and to control the optical excitation source 610, the waveplate assembly 625, and the RF excitation source 630, and the second magnetic field generator. The controller may include a processor 682 and a memory 684, in order to control the operation of the optical excitation source 610, the waveplate assembly 625, the RF excitation source 630, and the second magnetic field generator. The memory 684, which may include a non-transitory computer readable medium, may store instructions to allow the operation of the optical excitation source 610, the RF excitation source 630, and the second magnetic field generator to be controlled. That is, the controller 680 may be programmed to provide control. In some implementations, the controller 680 is configured to control an angle of the rotation of a half-wave plate.

Figure 7:
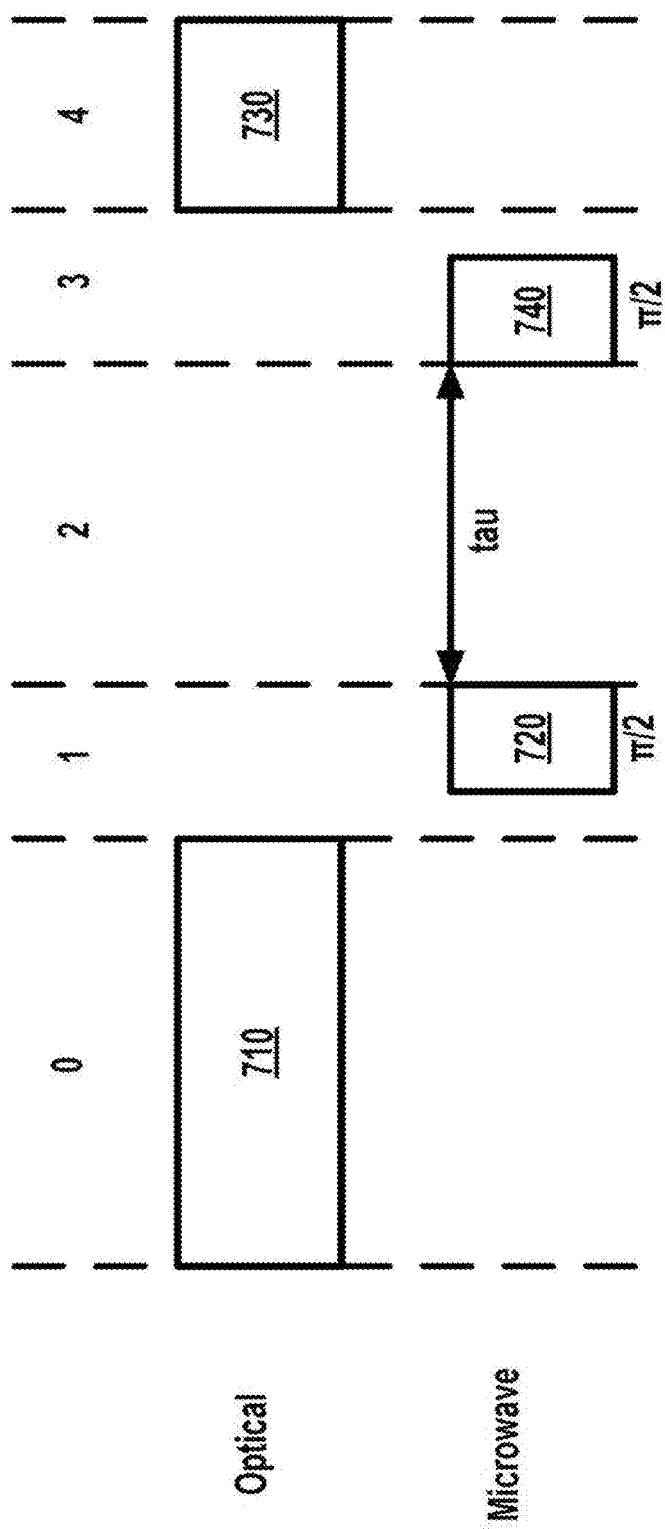
FIG. 7 is a schematic illustrating a Ramsey sequence of optical excitation pulses and RF excitation pulses according to an operation of the system in some embodiments.

FIG. 7 is a schematic diagram illustrating the Ramsey pulse sequence. As shown in FIG. 7, a Ramsey pulse sequence includes optical excitation pulses and RF excitation pulses over a five-step period. In a first step, during a period 0, a first optical excitation pulse 710 is applied to the system to optically pump electrons into the ground state (i.e., $m_{s=0}$ spin state). This is followed by a first RF excitation pulse 720 (in the form of, for example, a microwave (MW) π/2 pulse) during a period 1. The first RF excitation pulse 720 sets the system into superposition of the $m_{s=0}$ and $m_{s=+1}$ spin states (or, alternatively, the $m_{s=0}$ and $m_{s=-1}$ spin states, depending on the choice of resonance location). During a period 2, the system is allowed to freely precess (and dephase) over a time period referred to as tau (τ). During this free precession time period, the system measures the local magnetic field and serves as a coherent integration. Next, a second RF excitation pulse 740 (in the form of, for example, a MW π/2 pulse) is applied during a period 3 to project the system back to the $m_{s=0}$ and $m_{s=+1}$ basis. Finally, during a period 4, a second optical pulse 730 is applied to optically sample the system and a measurement basis is obtained by detecting the fluorescence intensity of the system. The RF excitation pulses applied to the system 600 are provided at a given RF frequency, which correspond to a given NV center orientation. The Ramsey pulse sequence shown in FIG. 12 may be performed multiple times, wherein each of the MW pulses applied to the system during a given Ramsey pulse sequence includes a different frequency that respectively corresponds to a different NV center orientation.

The theoretical measurement readout from a Ramsey pulse sequence may be defined as equation (1) below:

$$1 - e^{\frac{\tau}{T_2^*}} * \left(\frac{\omega_{res}}{\omega_{eff}}\right)^2 * \sum_{m=-1}^{1} \cos((2\pi(\Delta + m*a_n))*(\tau + \theta)) \tag{1}$$

In equation (1) above, τ represents the free precession time, $T^*_2$ represents spin dephasing due to inhomogeneities present in the system 600, $\omega_{res}$ represents the resonant Rabi frequency, $\omega_{eff}$ represents the effective Rabi frequency, $\alpha_n$ represents the hyperfine splitting of the NV diamond material 620 (~2.14 MHz), Δ represents the MW detuning, and θ represents the phase offset.

Figure 8A:
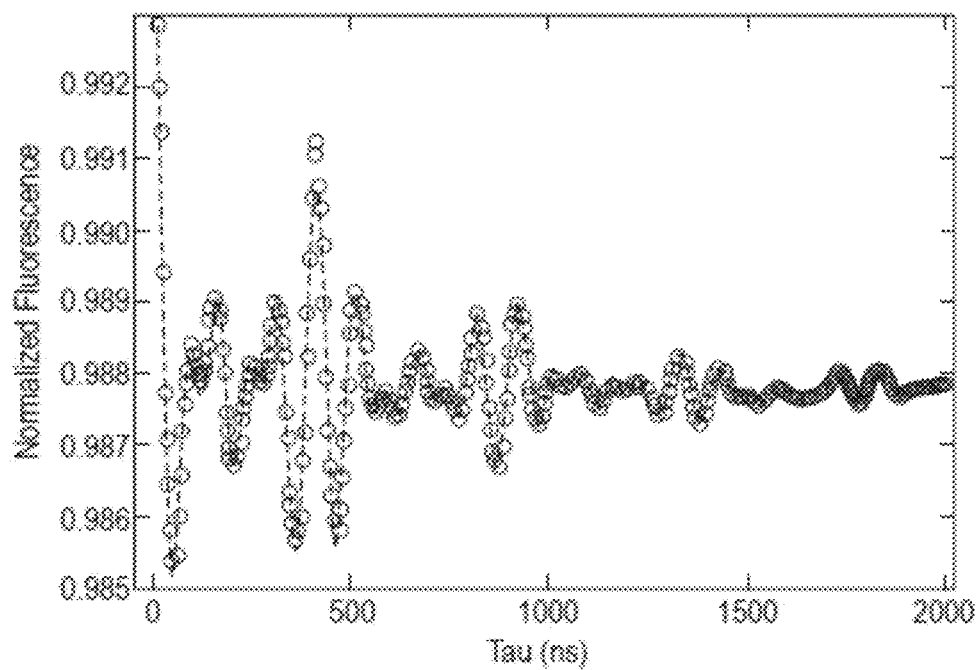
FIG. 8A is a free induction decay curve where a free precession time T is varied using a Ramsey sequence in some embodiments.
Figure 8B:
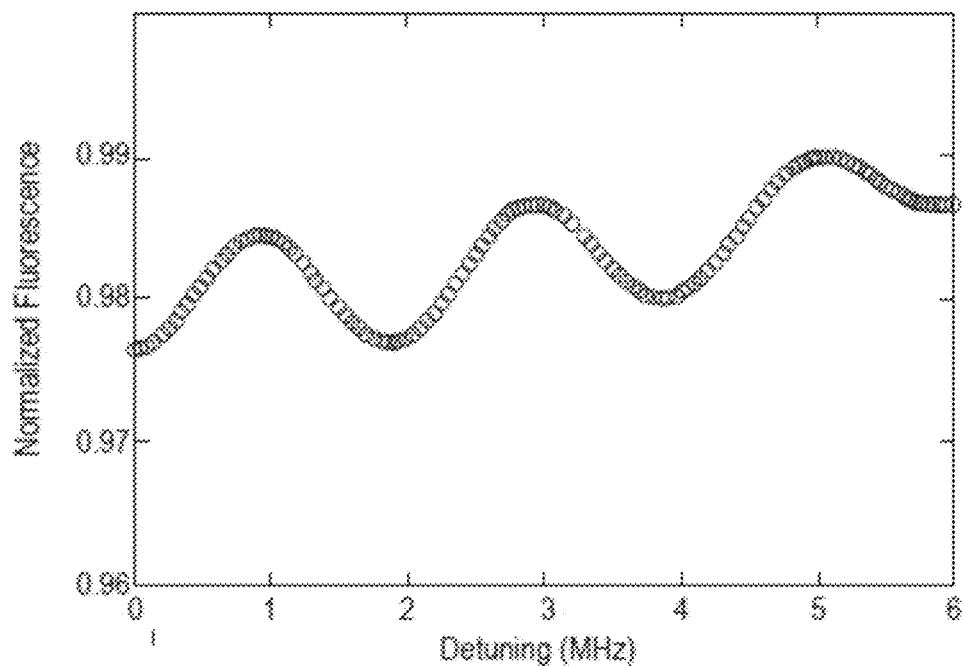
FIG. 8B is a magnetometry curve where a RF detuning frequency A is varied using a Ramsey sequence in some embodiments.

When taking a measurement based on a Ramsey pulse sequence, the parameters that may be controlled are the duration of the MW π/2 pulses, the frequency of the MW pulse (which is referenced as the frequency amount detuned from the resonance location, Δ), and the free precession time τ. FIGS. 8A and 8B show the effects on the variance of certain parameters of the Ramsey pulse sequence. For example, as shown in FIG. 8A, if all parameters are kept constant except for the free precession time τ, an interference pattern, known as the free induction decay (FID), is obtained. The FID curve is due to the constructive/destructive interference of the three sinusoids that correspond to the hyperfine splitting. The decay of the signal is due to inhomogeneous dephasing and the rate of this decay is characterized by $T^*_2$ (characteristic decay time). In addition, as shown in FIG. 8B, if all parameters are kept constant except for the microwave detuning Δ, a magnetometry curve is obtained. In this case, the x-axis may be converted to units of magnetic field through the conversion 1 nT=28 Hz in order to calibrate for magnetometry.

Figure 9:
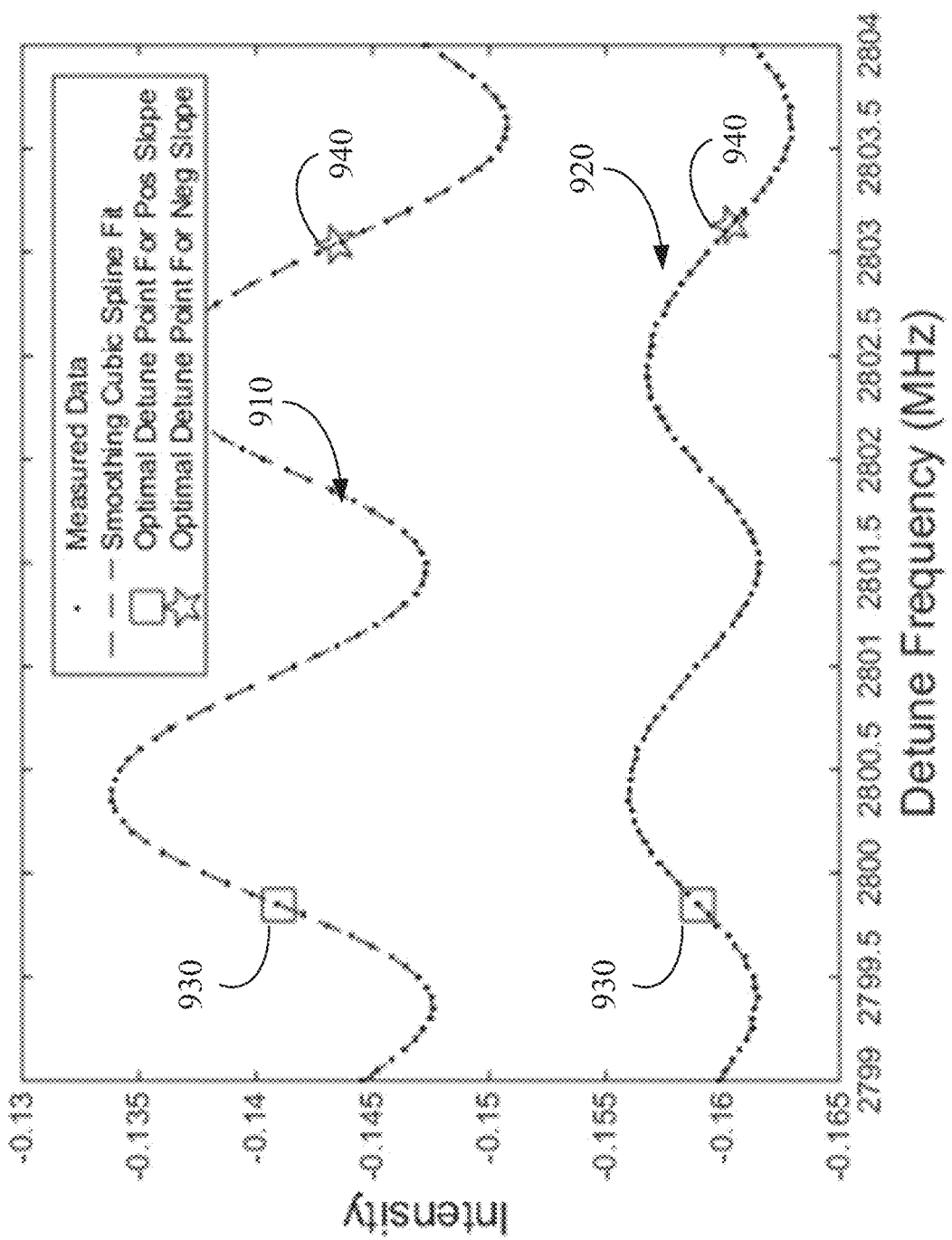
FIG. 9 is a graphical diagram depicting a reference signal intensity relative to detune frequency and a measured signal intensity relative to detune frequency in accordance with some embodiments.

FIG. 9 is a graphical diagram of an intensity of a measured signal 910 from an optical detector 640 relative to an intensity of a reference signal 920 from the optical detector 940 over a range of detune frequencies. When using a reference signal 920, the reference signal 920 will contain signal information from a prior RF pulse for a finite period of time. This prior signal information in the reference signal 920 reduces available detune Vpp and slope for a detune point for positive slope 930 and a detune point for negative slope 940. Thus, to remove the prior signal information, the system would need to wait until the prior signal information is eliminated from the reference signal or operate without the reference signal.

Figure 10:
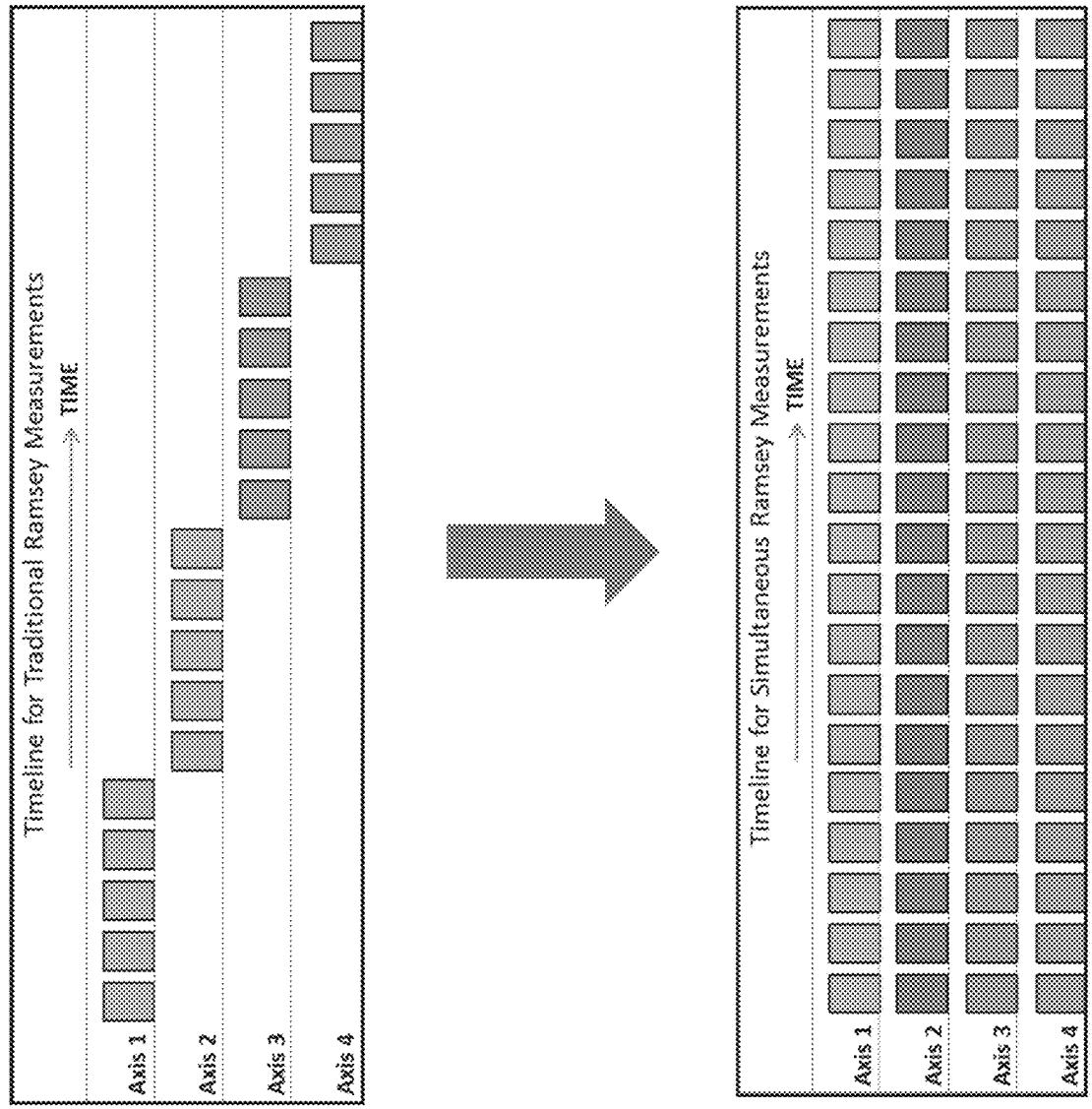
FIG. 10 is a graphical diagram illustrating bypassing the sensitivity loss incurred with sequential measurements with the use of simultaneous measurements in accordance with some embodiments.

FIG. 10 is a graphical diagram illustrating bypassing the sensitivity loss incurred with sequential measurements with the use of simultaneous measurements in accordance with some embodiments. The top timeline illustrates the timeline for sequential Ramsey measurements. In sequential Ramsey measurements, each axis of the magnate-optical defect material with defect centers is interrogated sequentially resulting in an approximate loss of sensitivity relative to scalar measurements of 1/(the square-root of the number of axes used). With sequential measurements, there is therefore a two times sensitivity loss relative to scalar magnetometry for four axes. The bottom timeline illustrates the timeline for simultaneous measurements. There is potentially no relative sensitivity loss relative to scalar measurements. Therefore, Ramsey pulses on a plurality of axes of a magneto-optical defect material with defect centers (e.g., a DNV), are measured while bypassing the sensitivity loss incurred with sequential measurement techniques.

Figure 11:
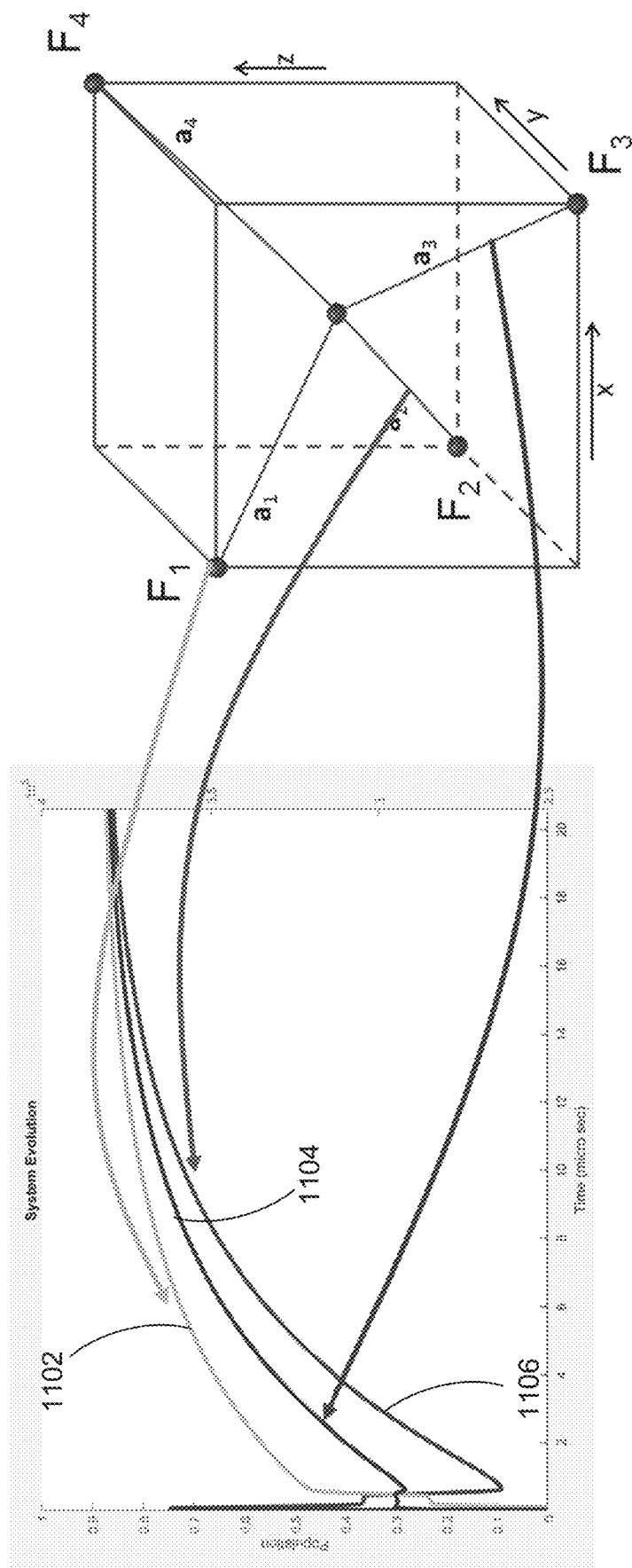
FIG. 11 is a graphical diagram illustrating the difficulty of applying a plurality of RF frequencies simultaneously to a magneto-optical defect material with defect centers (e.g., a DNV) using regular Ramsey pulses.

FIG. 11 is a graphical diagram illustrating the difficulty of applying a plurality of RF frequencies simultaneously to a magneto-optical defect material with defect centers (e.g., a DNV) using regular Ramsey pulses. One method to perform magnetic vector measurements on a sensor using magneto-optical defect center material with defect centers is to measure magnetic field projections on a plurality of the axes and then combine them to estimate the full magnetic field vector. As shown in FIG. 11, the projection on each axis $A_i$ is measured by interrogating the material with an RF pulse at a frequency $F_i$ that is near one of the two resonances of $A_i$ (either |0> to |−1> or |0> to |+1>). To interrogate a plurality of axes, a plurality of RF frequencies must be used. If the plurality of RF frequencies are applied simultaneously to the material using regular Ramsey pulses, then the measurements will get mixed together (e.g., 1102, 1104, and 1106) and cannot be isolated. This will prevent reconstruction of the magnetic field.

Figure 12:
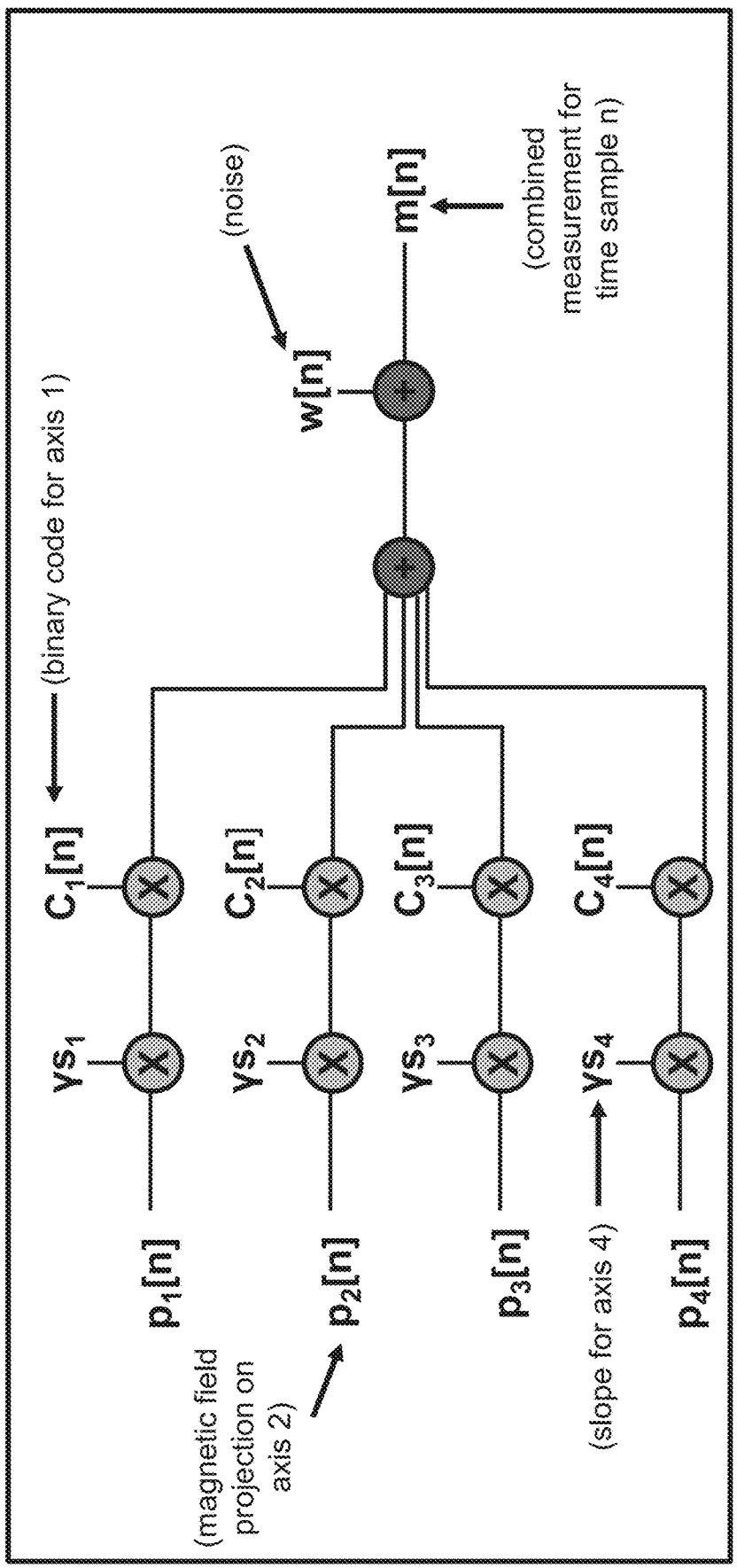
FIG. 12 is a graphical diagram illustrating a multiplexing step of multiple channels in accordance with some embodiments.
Figure 13:
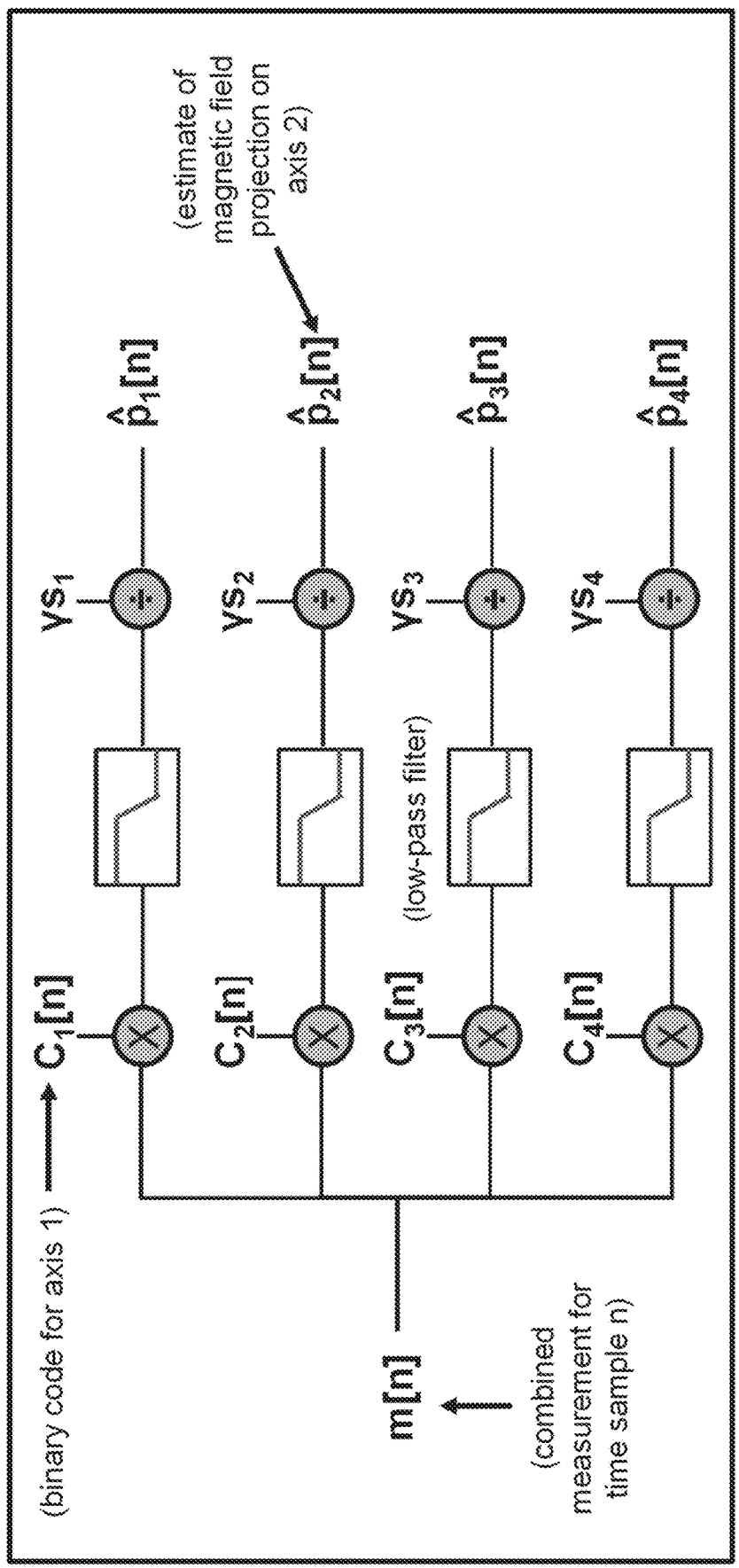
FIG. 13 is a graphical diagram illustrating a demultiplexing step into estimates of multiple individual measurements in accordance with some embodiments.

FIG. 12 is a graphical diagram illustrating a multiplexing step of multiple channels in accordance with some embodiments. As shown in FIG. 12, the measurements are combined together by modulating each channel i with a unique binary code $C_i[n]$, before they are then added together to form the measurement at time sample n: m[n]. The binary codes allow for the responses to be individually separated out during the subsequent demultiplexing step (e.g., as shown in FIG. 13). $P_i[n]$ illustrates the magnetic field projection on each of the plurality of axes i. $Ys_i[n]$ illustrates the slope for each of the plurality of axes.

FIG. 13 is a graphical diagram illustrating a demultiplexing step into estimates of multiple individual measurements in accordance with some embodiments. During this step, the combined measurement m[n] is separated out into estimates of the individual axes' measurements $p_i[n]$ by modulating with the unique binary code $c_i[n]$ for each axis i, and then low-pass filtering. The signal of the combined measurement m[n] is split so that the same signal is sent to be modulated by the plurality of binary codes $c_i[n]$. Each modulated version is then low pass filtered before being sent to subsequent processing stages for evaluation of the Ramsey pulses.

FIG. 14 is a flow diagram of a method 1400 of simultaneously measuring Ramsey pulses on a plurality of axes of a magneto-optical defect center material in accordance with some embodiments. In brief, the method comprises uniquely modulating a plurality of RF frequencies, applying the modulated frequencies to a magneto-optical defect center material with defect centers. The output is demodulated using an outer modular code. If frequency noise is bypassed, the output is demodulated using an inner modular code and then demodulated using an outer modular code.

The method 1400 begins when a plurality of RF frequencies are uniquely modulated at 1402. In some embodiments, each of the plurality of RF frequencies is uniquely modulated to each of a plurality of axes of a magneto-optical defect center material with defect centers with a custom set of orthogonal binary codes (sequences of +1 and −1) to each axis. In some embodiments, these codes are implemented by utilizing the 'shifted magnetometry adapted cancellation' (SMAC) technique, which provides a means to invert a magnetometry curve by changing the RF pulsewidth RF phase. In some embodiments, for a code value of +1, the magnetometry curve is left unmodified and for a code value of −1, the magnetometry curve is inverted (e.g., by applying a 180° phase shift to the second Ramsey pulse). In some embodiments, a spreading code is used to uniquely modulate each of the plurality of RF frequencies. In some embodiments, a spreading code changes the phase of Ramsey pulses to uniquely modulate each of the plurality of RF frequencies.

In some embodiments, while using the SMAC technique, sets of binary codes are used that allow for full isolation of signals on each axis that are bandlimited to:

$$\frac{\text{sampling frequency}}{2^{\# \text{ of channels}}}.$$

For example, one set of codes is
  One such set of codes is:
  1/f noise "channel" binary code: ++++ ++++ ++++ ++++
  Channel 1 binary code: +−+− +−+− +−+− +−+−
  Channel 2 binary code: +−−+ +−−+ +−−+ +−−+
  Channel 3 binary code: +−−+ −++− +−−+ −++−
  Channel 4 binary code: +−−+ −++− −++− +−−+

For a SMAC measurement, two different values of tau are used as well as two different values of the pulse width for each measurement of the pair. In a normal Ramsey excitation measurement, there would be repolarization of the system, double RF pulses separated by a gap for the free precession time, a start of the optical excitation and a readout during the optical excitation. In a SMAC excitation, there is a second set of RF pulses having a pulse width and tau values which may be different from the pulse width and tau of the first set. The first set of RF pulses is done with the first set of values, there is repolarization of the system, and then the second set of values is used to create an inverted curve. A SMAC pair estimate can also be created as a combination of the magnetometry curves of the two pulse sequences with different values.

The modulated frequencies are applied to a magneto-defect center material with defect centers at 1404. In some embodiments, the modulated frequencies are applied simultaneously as modulated Ramsey pulse sequences. Each of a plurality of frequencies can respectively correspond to a different defect center orientation of the magneto-defect center material (e.g., DNV).

A determination is made if frequency noise is being bypassed at 1406. If frequency noise is determined to be needed to bypass, the low frequency is bypassed at 1408. If the low frequency noise is determined not to be necessary to be bypassed, the method proceeds directly to demodulating the output using an outer modular code at 1412. In some embodiments, the outer modular code uses the SMAC technique discussed above as the outer modular code to demodulate the output using. The code is demodulated using the respective binary code used while administering the SMAC technique. For a code value of +1, where the magnetometry curve was left unmodified, the corresponding fluorescence of the output is associated with a fluorescence low point. For a code value of −1, where the magnetometry curve is inverted, the corresponding fluorescence of the output is associated with a fluorescence null point. In some embodiments, a Walsh-Hadamard sequence is used as the outer modulation code when the plurality of RF frequencies was modulated using code-division multiple access (CDMA).

In an illustrative embodiment, any of the operations described herein can be implemented at least in part as computer-readable instructions stored on a computer-readable memory. Upon execution of the computer-readable instructions by a processor, the computer-readable instructions can cause a node to perform the operations.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:
1. A system for magnetic detection, comprising:
a magneto-optical defect center material comprising a plurality of defect centers and lattice oriented subsets;
a radio frequency (RF) excitation source configured to provide RF excitation to the magneto-optical defect center material;
an optical excitation source configured to provide optical excitation to the magneto-optical defect center material;
an optical detector configured to receive an optical signal emitted by the magneto-optical defect center material;
a bias magnet configured to separate RF resonance responses of the lattice oriented subsets of the magneto-optical defect center material; and
a controller configured to:
control the optical excitation source and the RF excitation source to apply a first binary code sequence to the magneto-optical defect center material comprised of a first binary code sequence value and a second binary code sequence value using a first RF frequency value;
control the optical excitation source and the RF excitation source to apply a second binary code sequence to the magneto-optical defect center material comprised of the first binary code sequence value and the second binary code sequence value using a second RF frequency value;
wherein the first binary code sequence value comprises a first optical excitation pulse, a first pair of RF excitation pulses separated by a first time period, and a second optical excitation pulse to the magneto-optical defect center material;
wherein the second binary code sequence value comprises a third optical excitation pulse, a second pair of RF excitation pulses separated by a second time period, and a fourth optical excitation pulse to the magneto-optical defect center material;
wherein the first binary code sequence is orthogonal to the second binary code sequence;
wherein a pulse width of the first pair of RF excitation pulses is different than a pulse width of the second pair of RF excitation pulses, and wherein the first time period is different than the second time period;
modulate a light detection signal from the optical detector using the first binary code sequence and the second binary code sequence by:
sending the light detection signal to a first modulator for the first binary code sequence;
sending the light detection signal to a second modulator for the second binary code sequence;
sending an output of the first modulator to a first low pass filter;
sending an output of the second modulator to a second low pass filter; and
estimate a magnetic field projection based on the output of the first low pass filter and the output of the second low pass filter.

2. The system of claim 1, wherein the controller is further configured to:
control the optical excitation source and the RF excitation source to apply a third binary code sequence to the magneto-optical defect center material comprised of the first binary code sequence value and the second binary code sequence value using a third RF frequency value;
wherein the third binary code sequence is orthogonal to the first binary code sequence and to the second binary code sequence;
modulate the light detection signal from the optical detector using the third binary code sequence by:
sending the light detection signal to a third modulator for the third binary code sequence;
sending the output of the third modulator to a third low pass filter;
sending the output of the second modulator to a second low pass filter; and
estimate the magnetic field projection further based on the output of the third low pass filter.

3. The system of claim 1, wherein the first RF frequency value is associated with a first axis of a defect center of the magneto-optical defect center material and the second RF frequency value is associated with a second axis of a defect center of the magneto-optical defect center material.

4. The system of claim 1, wherein the controller is further configured to compute a change in an external magnetic field acting on the magneto-optical defect center material based on the estimate of the magnetic field projection.

5. The system of claim 1, wherein the second pair of RF excitation pulses of the first pulse sequence are applied at a frequency detuned from a resonance frequency of the magneto-optical defect center material.

6. The system of claim 1, wherein the pulse width of the second pair of RF excitation pulses is associated with a fluorescence null point of the magneto-optical defect center material.

7. The system of claim 1, wherein the second time period is associated with a fluorescence null point of the magneto-optical defect center material.

8. The system of claim 1, wherein the pulse width of the second pair of RF excitation pulses and the second time period is associated with a fluorescence null point of the magneto-optical defect center material.

9. The system of claim 1, wherein the RF excitation source is a microwave antenna.

10. The system of claim 1, wherein the first binary code sequence comprises the first binary code sequence value followed by the second binary sequence value.

11. The system of claim 8, wherein the pulse width of the first pair of RF excitation pulses and the first time period is associated with a fluorescence low point of the magneto-optical defect center material.

12. The system of claim 1, wherein the bias magnet is one of a permanent magnet, a magnet field generator, or a Halbach set of permanent magnets.

13. A method for magnetic detection using a magneto-optical defect center material comprising a plurality of defect centers, the method comprising:
applying a first binary code sequence to the magneto-optical defect center material comprised of a first binary code sequence value and a second binary code sequence value using a first RF frequency value;
applying a second binary code sequence to the magneto-optical defect center material comprised of the first binary code sequence value and the second binary code sequence value using a second RF frequency value;
modulating a light detection signal from the optical detector using the first binary code sequence and the second binary code sequence by:
splitting the light detection signal to a first light detection signal and a second light detection signal;
modulating the first light detection signal using the first binary code sequence;

modulating the second light detection signal using the second binary code sequence;
low pass filtering the modulated first light detection signal; and
low pass filtering the modulated second light detection signal; and
estimating a magnetic field projection based on the low pass filtered, modulated first light detection signal and the low pass filtered, modulated second light detection signal;
wherein the first binary code sequence value comprises a first optical excitation pulse, a first pair of RF excitation pulses separated by a first time period, and a second optical excitation pulse to the magneto-optical defect center material;
wherein the second binary code sequence value comprises a third optical excitation pulse, a second pair of RF excitation pulses separated by a second time period, and a fourth optical excitation pulse to the magneto-optical defect center material;
wherein the first binary code sequence is orthogonal to the second binary code sequence; and
wherein a pulse width of the first pair of RF excitation pulses is different than a pulse width of the second pair of RF excitation pulses, and wherein the first time period is different than the second time period.

14. The method of claim 13, wherein the first RF frequency value is associated with a first axis of a defect center of the magneto-optical defect center material and the second RF frequency.

15. The method of claim 13, further comprising computing a change in an external magnetic field acting on the magneto-optical defect center material based on the estimate of the magnetic field projection.

16. The method of claim 13, wherein the second pair of RF excitation pulses of the first pulse sequence are applied at a frequency detuned from a resonance frequency of the magneto- optical defect center material.

17. The method of claim 13, wherein the pulse width of the second pair of RF excitation pulses is associated with a fluorescence null point of the magneto-optical defect center material.

18. The method of claim 13, wherein the second time period is associated with a fluorescence null point of the magneto-optical defect center material.

19. The method of claim 13, wherein the pulse width of the second pair of RF excitation pulses and the second time period is associated with a fluorescence null point of the magneto- optical defect center material.

20. The method of claim 13, wherein the first binary code sequence comprises the first binary code sequence value followed by the second binary sequence value.

21. The method of claim 20, wherein the pulse width of the first pair of RF excitation pulses and the first time period is associated with a fluorescence low point of the magneto- optical defect center material.

22. A magnetic detection system comprising:
a defect center material responsive to an applied magnetic field;
a radio frequency (RF) emitter operational to provide a first binary code sequence to the defect center material using a first RF frequency value and a second binary code sequence to the defect center material using a second RF frequency value,
wherein the binary code sequences are comprised of first binary code sequence and second binary code sequence, wherein the first binary code sequence are orthogonal to the second binary code sequence, wherein the first binary code sequence comprises a first RF pulse sequence and the second binary code sequence comprises a second RF pulse sequence that is different from the first RF pulse sequence, and wherein a first pulse width of the first RF pulse sequence is different from a second pulse width of the second RF pulse sequence;
a detector operational to measure a fluorescence of the defect center material in conjunction with the first binary code sequence and the second binary code sequence;
a control circuit connected to the detector and operational to modulate the measured fluorescence using the first binary code sequence and the second binary code sequence by:
sending the fluorescence to a first modulator for the first binary code sequence;
sending the fluorescence to a second modulator for the second binary code sequence;
sending an output of the first modulator to a first low pass filter;
sending an output of the second modulator to a second low pass filter; and
estimate a magnetic field projection based on the output of the first low pass filter and the output of the second low pass filter.

23. The system of claim 22, wherein the first RF frequency value and the second RF frequency value are frequencies detuned from a resonance frequency of the defect center material.

24. The system of claim 22, wherein the first binary code sequence comprises the first binary code sequence value followed by the second binary code sequence value.

25. The system of claim 22, wherein the defect center material is a nitrogen vacancy diamond.

26. The system of claim 22, wherein the defect center material is Silicon Carbide (SiC).

27. A system for magnetic detection, comprising:
a magneto-optical defect center material comprising a plurality of defect centers;
a means of providing RF excitation to the magneto-optical defect center material;
a means of providing optical excitation to the magneto-optical defect center material;
a means of receiving an optical signal emitted by the magneto-optical defect center material;
a means of providing a bias magnetic offset to distinguish response curves of different lattice orientation subsets of the magneto-optical defect center material; and
a means of controlling the provided RF excitation and provided optical excitation to:
apply a first binary code sequence to the magneto-optical defect center material comprised of a first binary code sequence value and a second binary code sequence value using a first RF frequency value; and
apply a second binary code sequence to the magneto-optical defect center material comprised of the first binary code sequence value and the second binary code sequence value using a second RF frequency value;
wherein the first binary code sequence value comprises a first optical excitation pulse, a first pair of RF excitation pulses separated by a first time period, and a second optical excitation pulse to the magneto-optical defect center material;

wherein the second binary code sequence value comprises a third optical excitation pulse, a second pair of RF excitation pulses separated by a second time period, and a fourth optical excitation pulse to the magneto-optical defect center material;

wherein the first binary code sequence is orthogonal to the second binary code sequence;

wherein a pulse width of the first pair of RF excitation pulses is different than a pulse width of the second pair of RF excitation pulses, and wherein the first time period is different than the second time period; and a means to modulate a light detection signal from the optical detector using the first binary code sequence and the second binary code sequence by:
  sending the light detection signal to a first modulator for the first binary code sequence;
  sending the light detection signal to a second modulator for the second binary code sequence;
  sending an output of the first modulator to a first low pass filter;
  sending an output of the second modulator to a second low pass filter; and a means to estimate a magnetic field projection based on the output of the first low pass filter and the output of the second low pass filter.

* * * * *